US009671663B2

(12) United States Patent
Yonekura

(10) Patent No.: US 9,671,663 B2
(45) Date of Patent: Jun. 6, 2017

(54) LIQUID CRYSTAL DISPLAY

(71) Applicant: Japan Display Inc., Minato-ku (JP)

(72) Inventor: Toshimasa Yonekura, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/267,583

(22) Filed: Sep. 16, 2016

(65) Prior Publication Data

US 2017/0003561 A1 Jan. 5, 2017

Related U.S. Application Data

(63) Continuation of application No. 14/748,781, filed on Jun. 24, 2015, now Pat. No. 9,477,126, which is a
(Continued)

(30) Foreign Application Priority Data

Aug. 29, 2012 (JP) ................................. 2012-188970

(51) Int. Cl.
*G02F 1/1362* (2006.01)
*H01L 27/12* (2006.01)
(Continued)

(52) U.S. Cl.
CPC ...... *G02F 1/136286* (2013.01); *G02F 1/1368* (2013.01); *G02F 1/13624* (2013.01);
(Continued)

(58) Field of Classification Search
CPC ........... G02F 1/136213; G02F 1/13624; G02F 1/133512; G02F 1/136286;
(Continued)

(56) References Cited

U.S. PATENT DOCUMENTS 7,808,494 B2* 10/2010 Lee ................... G02F 1/136286
345/100
7,910,931 B2* 3/2011 Kim .................. G02F 1/136213
257/72
(Continued)

FOREIGN PATENT DOCUMENTS

JP 2007-123900 A 5/2007
JP 2007-128092 A 5/2007
(Continued)

OTHER PUBLICATIONS

Office Action issued on May 10, 2016 in Japanese Patent Application No. 2012-188970 (with English language translation).

*Primary Examiner* — Dennis Y Kim
(74) *Attorney, Agent, or Firm* — Oblon, McClelland, Maier & Neustadt, L.L.P.

(57) ABSTRACT

According to one embodiment, a liquid crystal display includes an array substrate provided with pixel electrodes including a first pixel electrode and a second pixel electrode aligning in a first direction, a first gate line placed on one side of the pixel electrodes in a second direction, a second gate line placed on the other side of the pixel electrodes, a source line extending along the second direction, a first pixel switch for switching connection of the source line with the first pixel electrode by a gate signal provided through the first gate line, and a second pixel switch for switching connection of the source line with the second pixel electrode by another gate signal provided through the second gate line, an counter-substrate provided with an common electrode, and a liquid crystal layer held between the substrates.

8 Claims, 6 Drawing Sheets

Related U.S. Application Data continuation of application No. 14/012,116, filed on Aug. 28, 2013, now Pat. No. 9,116,404.

(51) Int. Cl.

| | |
|---|---|
| *H01L 29/786* | (2006.01) |
| *G02F 1/1343* | (2006.01) |
| *G02F 1/1368* | (2006.01) |
| *G02F 1/1335* | (2006.01) |
| *G02F 1/1337* | (2006.01) |
| *G02F 1/1333* | (2006.01) |
| *G02F 1/133* | (2006.01) |

(52) U.S. Cl.
CPC .. *G02F 1/134336* (2013.01); *G02F 1/136213* (2013.01); *G02F 1/136277* (2013.01); *H01L 27/1222* (2013.01); *H01L 27/1244* (2013.01); *H01L 27/1255* (2013.01); *H01L 29/78669* (2013.01); *G02F 1/13306* (2013.01); *G02F 1/13378* (2013.01); *G02F 1/133345* (2013.01); *G02F 1/133512* (2013.01); *G02F 1/133514* (2013.01); *G02F 1/136227* (2013.01); *G02F 2001/133519* (2013.01); *G02F 2001/133738* (2013.01); *G02F 2001/134345* (2013.01); *G02F 2201/121* (2013.01); *G02F 2201/123* (2013.01); *G02F 2202/103* (2013.01)

(58) Field of Classification Search
CPC ... G02F 2001/134345; G02F 1/134336; G02F 2001/134354; G02F 1/1368; G02F 1/136277; G02F 2201/123; G02F 2001/133738; G02F 1/133345; G02F 1/133514; G02F 2202/103; G02F 2201/121; G02F 1/13306; G02F 1/136227; H01L 27/1222; H01L 29/78669; H01L 27/1244; H01L 27/1255
See application file for complete search history.

(56) References Cited

U.S. PATENT DOCUMENTS

| | | | |
|---|---|---|---|
| 8,305,506 | B2 * | 11/2012 | Chang ............... G02F 1/136213 349/139 |
| 8,908,114 | B2 | 12/2014 | Nagami |
| 9,140,948 | B2 | 9/2015 | Chang |
| 2004/0080681 | A1 | 4/2004 | Moon |
| 2005/0231455 | A1 | 10/2005 | Moon |
| 2006/0081850 | A1 | 4/2006 | Lee et al. |
| 2009/0135125 | A1 | 5/2009 | Park |
| 2010/0225859 | A1 | 9/2010 | Tsai et al. |
| 2011/0006975 | A1 | 1/2011 | Nagashima et al. |
| 2011/0181805 | A1 | 7/2011 | Nagami |
| 2012/0092241 | A1 | 4/2012 | Shang |
| 2012/0104394 | A1 | 5/2012 | Park |

FOREIGN PATENT DOCUMENTS

| | | |
|---|---|---|
| JP | 2009-128907 A | 6/2009 |
| JP | 2012-88710 | 5/2012 |
| JP | 2012-133367 A | 7/2012 |

* cited by examiner

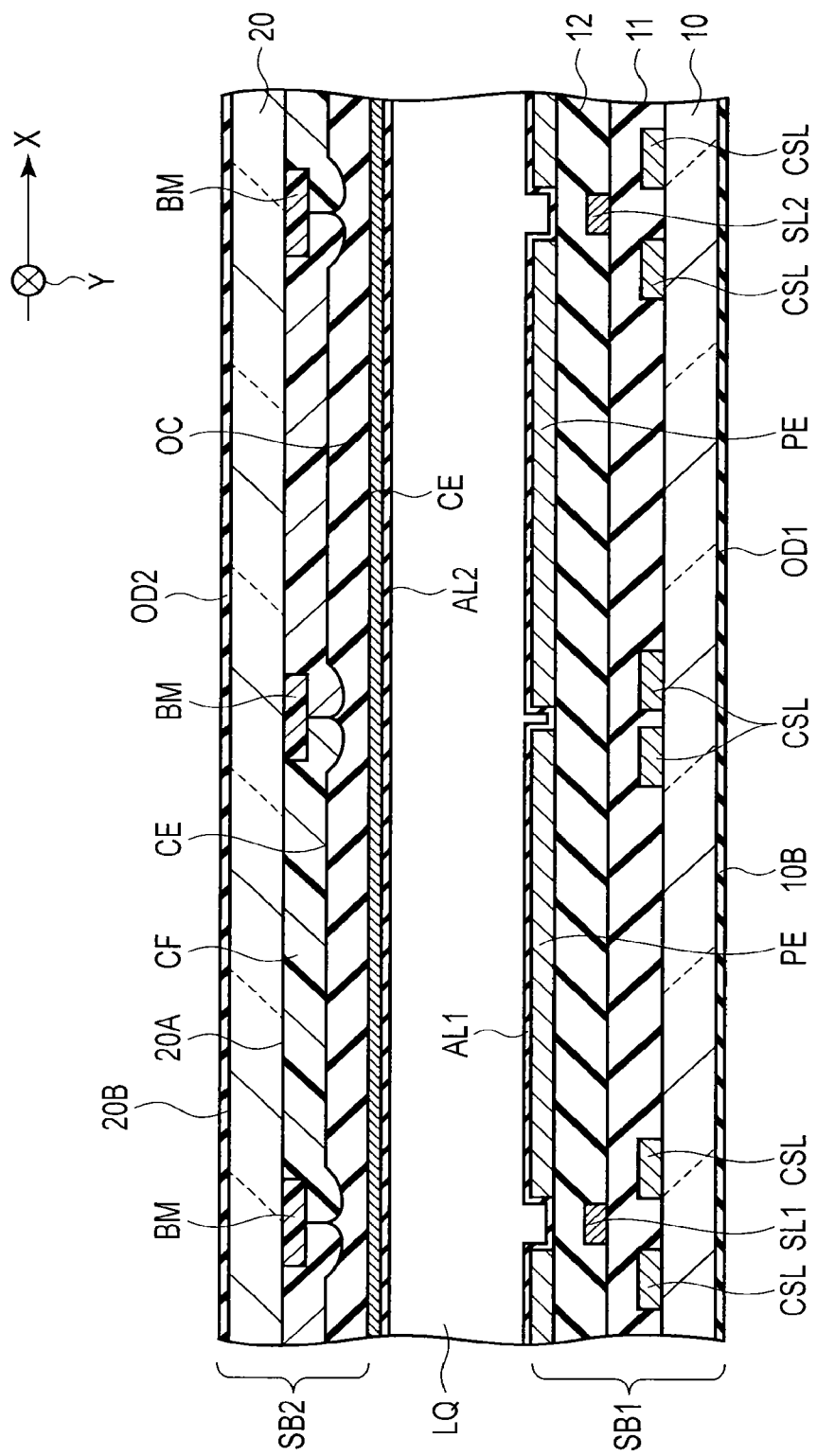
F I G. 3

LIQUID CRYSTAL DISPLAY

CROSS-REFERENCE TO RELATED APPLICATIONS

This application is a continuation of U.S. application Ser. No. 14/748,781 filed Jun. 24, 2015, which a continuation of U.S. application Ser. No. 14/012,116 filed Aug. 28, 2013, which is based upon and claims the benefit of priority from Japanese Patent Application No. 2012-188970, filed Aug. 29, 2012, the entire contents of each of which are incorporated herein by reference.

FIELD

Embodiments described herein relate generally to a liquid crystal display.

BACKGROUND

Flat displays have been developed actively in recent years, and liquid crystal displays have been particularly used in a variety of fields due to advantageous features such as light weight, low profile, low power consumption, and the like. Such a liquid crystal display has a configuration of retaining a liquid crystal layer between a pair of substrates, and controls the modulation rate with respect to light passing through the liquid crystal layer by the electric field between a pixel electrode and a common electrode to display an image.

An active matrix liquid crystal display has a display portion including matrix-arranged display pixels, a drive line, and a drive circuit for driving the display pixels through the drive line.

BRIEF DESCRIPTION OF THE DRAWINGS

FIG. 3 is a schematic cross-sectional view of a liquid crystal display, taken from line III-III of FIG. 2;

DETAILED DESCRIPTION

In general, according to one embodiment, the liquid crystal display has an array substrate provided with a plurality of matrix-arranged pixel electrodes, a first gate line placed on one side of a row of the pixel electrodes in a column direction, a second gate line placed on the other side of the row of the pixel electrodes, a source line extending along the column in which the pixel electrodes are arranged, a first pixel switch for switching connection of the source line with the pixel electrode by a gate signal provided through the first gate line, and a second pixel switch for switching connection of the source line with the pixel electrode by another gate signal provided through the second gate line; an counter-substrate provided with an common electrode opposing the plurality of pixel electrodes; and a liquid crystal layer held between the array substrate and the counter-substrate.

The liquid crystal display of an embodiment will be described below with reference to the attached drawings.

Figure 1:
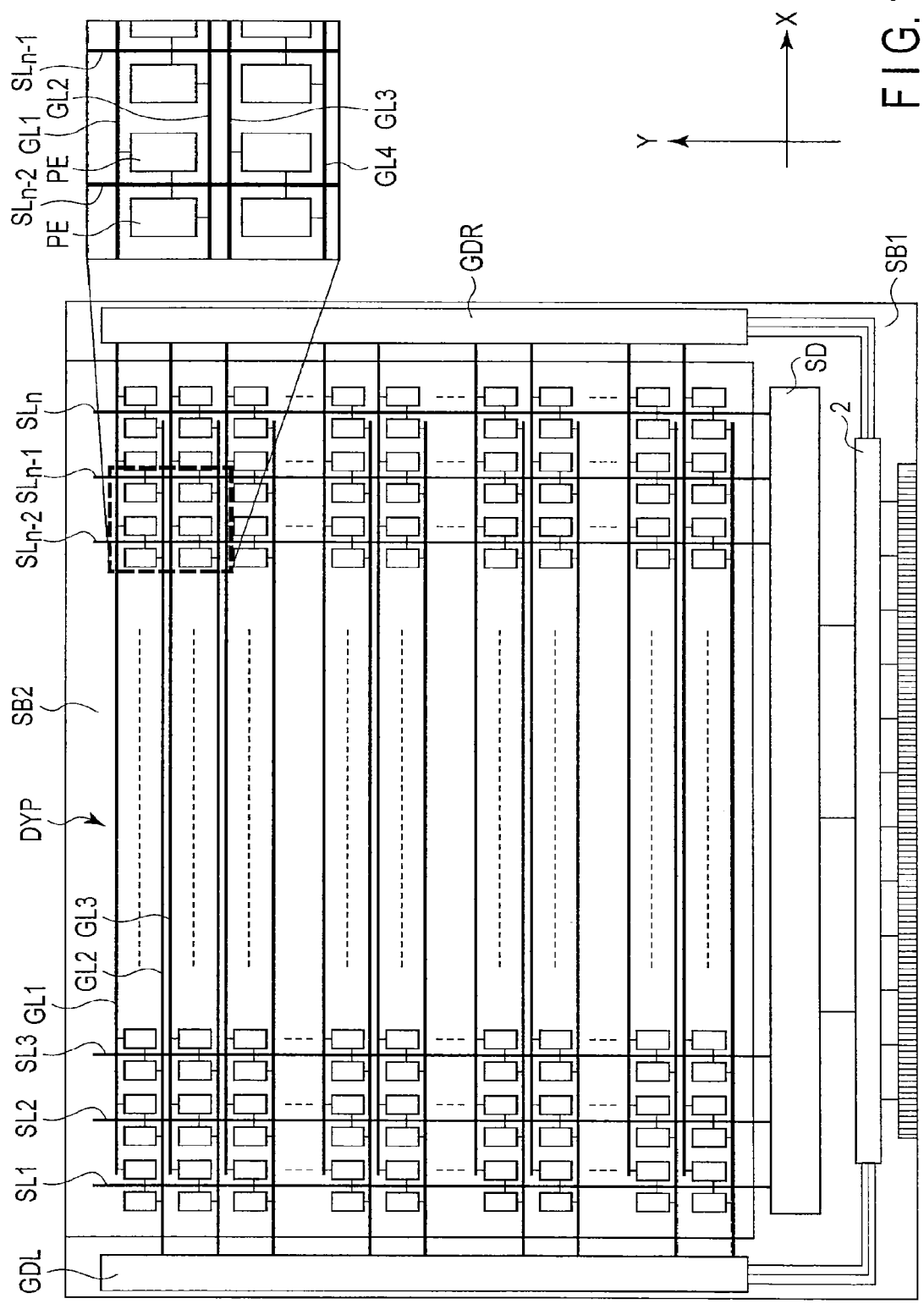
FIG. 1 is a drawing schematically illustrating a configuration example of the liquid crystal display according to an embodiment.

FIG. 1 is a drawing schematically illustrating a configuration example of the liquid crystal display according to the embodiment.

The display according to the embodiment is a liquid crystal display provided with an array substrate SB1, an counter-substrate SB2 disposed to oppose to the array substrate SB1, a liquid crystal layer sandwiched between the array substrate SB1 and the counter-substrate SB2 (illustrated in FIG. 3), and a display portion containing a plurality of matrix-arranged display pixels PX. In the example presented in FIG. 1, the display pixels PX are arranged in a matrix with m rows and 2n columns (m and n are each a positive integer).

Figure 2:
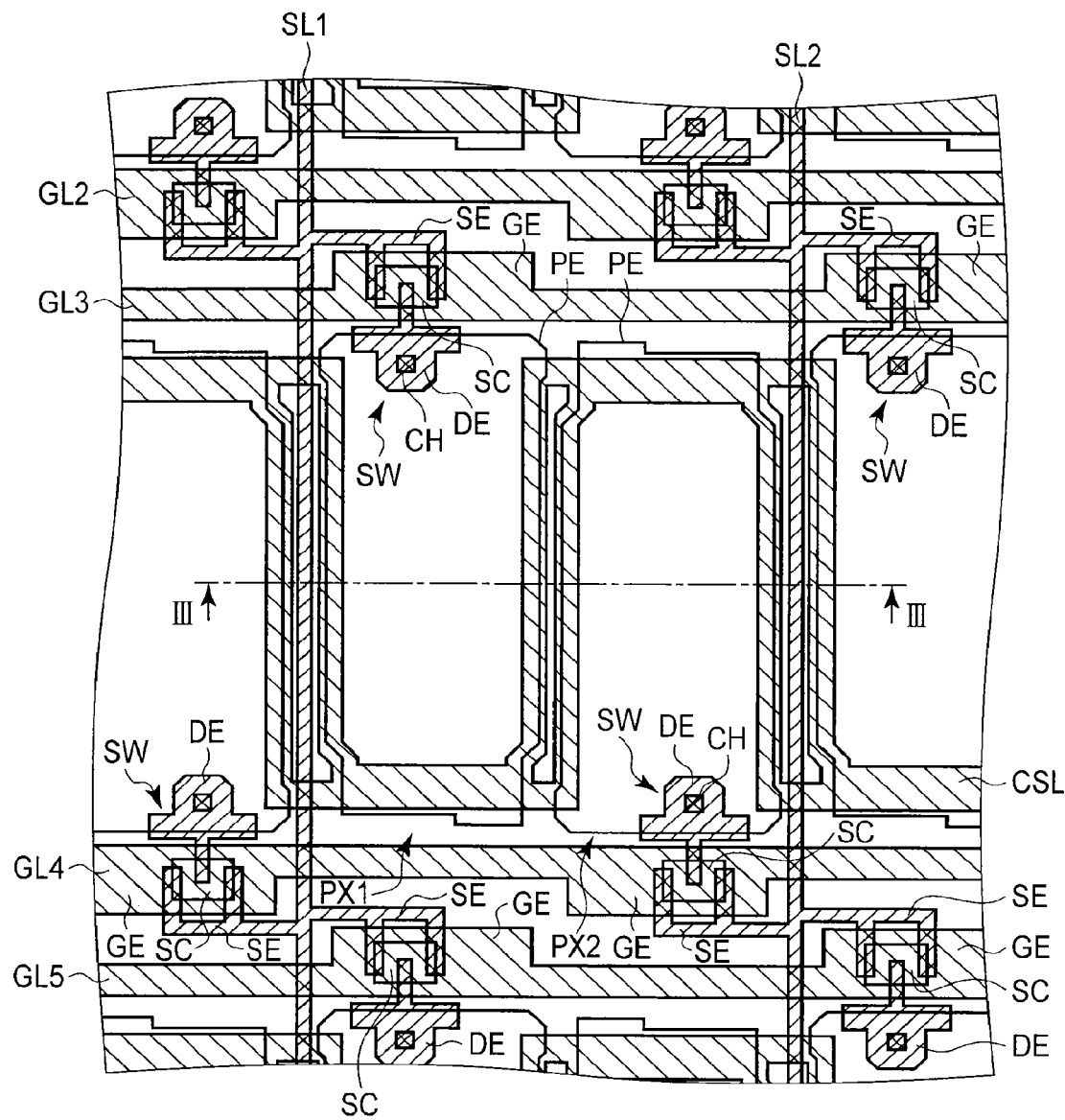
FIG. 2 is a drawing schematically illustrating a configuration example of display pixels of the liquid crystal display illustrated in FIG. 1.

The array substrate SB1 has pixel electrodes PE respectively disposed in the display pixels in the display portion DYP, gate lines GL (GL1, GL2, ..., GL2m) extending along the row direction (first direction X) in which the pixel electrodes PE are arranged, source lines SL (SL1, SL2, ..., SLn) extending along the column direction (second direction Y) in which the pixel electrodes PE are arranged, and pixel switches disposed in the vicinity of each of the intersections of the gate lines GL and source lines SL (illustrated in FIG. 2).

The array substrate SB1 also has a drive circuit arranged around the display portion DYP, and a drive IC chip 2 including a controller integrated therein. The drive circuit has gate drivers GDL, GDR for driving the gate lines GL and a source driver SD for driving the source lines SL. At least a portion of these gate drivers GDL, GDR and source driver SD is formed, for example, in the array substrate SB1 and is connected to the drive IC chip 2 including a controller.

The gate driver GDL is arranged on one side of the display portion DYP in the first direction X, while the gate driver GDR is arranged on the other side of the display portion DYP in the first direction X. To the gate driver GDL, the even-numbered gate lines GL2, GL4, ..., GL2m are electrically connected, while the odd-numbered gate lines GL1, GL3, ..., GL2m-1 are electrically connected to the gate driver GDR. The gate drivers GDL, GDR each sequentially output a drive signal to the gate lines GL based on a clock signal, horizontal synchronous signal, and the like input from the drive IC chip 2.

The source driver SD is arranged on one side of the display portion DYP in the second direction Y. To the source driver SD, the source lines SL are electrically connected. Based on a clock signal, vertical synchronous signal, and the like input from the drive IC chip 2, the source driver SD outputs a corresponding image signal to the source lines SL.

The counter-substrate SB2 is provided with a common electrode (illustrated in FIG. 3) arranged in the display portion DYP. The common electrode is disposed to oppose the pixel electrodes PE.

FIG. 2 is a drawing schematically illustrating a configuration example of the display pixels of the liquid crystal display illustrated in FIG. 1.

The gate lines GL each extend along the first direction X in between rows of the pixel electrodes PE aligning in the first direction X. In the liquid crystal display of this embodiment, the gate lines GL are placed on both sides of the pixel electrodes PE, which align in the first direction X, in the second direction Y. In other words, two gate lines GL are placed between adjacent rows of the pixel electrodes PE aligning in the first direction X.

The source lines SL each extend along the second direction Y in between columns of the pixel electrodes PE aligning in the second direction Y. In the liquid crystal display of this embodiment, the source lines SL are placed on both sides of two columns of the pixel electrodes PE each aligning in the second direction Y. In other words, the source lines SL are disposed on every two columns of the pixel electrodes PE aligning in the second direction Y.

In FIG. 2, an area around the intersections of the source lines SL1, SL2 and gate lines GL3, GL4 is schematically illustrated. It is noted that, in the explanation below, the display pixel arranged in the area enclosed with the source lines SL1, SL2 and gate lines GL3, GL4, and located on the side of the source line SL1 is denoted as PX1, while the display pixel located on the side of the source line SL2 is denoted as PX2.

The pixel electrode (first pixel electrode) PE of the display pixel PX1 is connected to the source line SL1 through the pixel switch (first pixel switch) SW disposed in the vicinity of the intersection of the gate line (first gate line) GL3 and the source line SL1. That is, the pixel electrode PE of the display pixel PX1 is caused to switch the connection with the source line SL1 by the pixel switch SW, which is placed on an upper side with respect to the pixel electrode PE in the drawing.

The pixel switch SW is, for example, a thin film transistor (TFT) and has a gate electrode GE, a source electrode SE, a drain electrode DE, and a semiconductor layer SC formed of amorphous silicon.

The semiconductor layer SC is placed on the gate electrode GE through an insulation layer. The gate electrode GE is formed in a layer identical with that of the gate lines GL, and the source electrode SE and drain electrode DE are formed in a layer identical with that of the source lines SL.

In the display pixel PX1, the gate electrode GE is electrically connected to the gate line GL3 (or integrally formed therewith), the source electrode SE is electrically connected to the source line SL1 (or integrally formed therewith), and the drain electrode DE is electrically connected to the pixel electrode PE (or integrally formed therewith). The drain electrode DE is electrically connected to the pixel electrode PE at an upper portion thereof through a contact hole CH, and extends from the upper portion of the pixel electrode PE upward in the drawing to a lower portion of the semiconductor layer SC.

The pixel electrode (second pixel electrode) PE of the display pixel PX2 is connected to the source line SL2 through the pixel switch (second pixel switch) SW disposed in the vicinity of the intersections of the gate line (second gate line) GL4 and the source line SL2. That is, the pixel electrode PE of the display pixel PX2 is allowed to switch the connection with the source line SL2 by the pixel switch SW, which is located on a lower side with respect to the pixel electrode PE in the drawing.

In the display pixel PX2, the gate electrode GE is electrically connected to the gate line GL4 (or integrally formed therewith), the source electrode SE is electrically connected to the source line SL2 (or integrally formed therewith), and the drain electrode DE is electrically connected to the pixel electrode PE (or integrally formed therewith). The drain electrode DE is electrically connected to the pixel electrode PE at a lower portion thereof through another contact hole CH, and extends from the lower portion of the pixel electrode PE downward in the drawing to an upper portion of the semiconductor layer SC.

That is, the pixel electrode PE of the display pixel PX1 is electrically connected to the source line SL1 disposed on the left side thereof through the pixel switch SW, and the pixel electrode PE of the display pixel PX2 is electrically connected to the source line SL2 disposed on the right side thereof through the other pixel switch SW.

In other words, display pixels including the same configuration as that of the first display pixel PX1 and display pixels including the same configuration as that of the second display pixel PX2 are arranged in the first direction so as to alternately align, and each of the source lines SL is electrically connected to the display pixels PX on both sides thereof through the pixel electrode PE and pixel switch SW of the respective display pixels PX.

The source driver SD is able to drive the display pixels PX of 2n columns by n pieces of source lines SL1 to SLn. The liquid crystal display of this embodiment is therefore able to be materialized without using a costly source driver.

The array substrate SB1 has an auxiliary capacity line CSL that is arranged so as to oppose a portion of the pixel electrodes PE through the insulation layer (illustrated in FIG. 3) in the thickness direction of the substrate. The thickness direction of the substrate is a direction substantially orthogonal to both the first direction X and the second direction Y.

The auxiliary capacity line CSL runs in a meandering shape along the edge of the pixel electrodes PE. In the display pixel PX1, the pixel electrode PE opposes the auxiliary capacity line CSL at the edges thereof extending substantially in parallel to the second direction Y and at the edge on the lower side thereof (one side in the second direction Y). That is, the pixel electrode PE and auxiliary capacity line CSL oppose to each other at the edges of pixel electrode PE except the edge connected with the pixel switch SW.

The auxiliary capacity line CSL is electrically connected to a voltage application portion (not illustrated) from which an auxiliary capacity voltage is applied.

FIG. 3 is a schematic cross-sectional view of the liquid crystal display, taken from line III-III of FIG. 2. It is noted that only a portion necessary for an explanation is herein illustrated.

There is disposed a backlight (not illustrated) on the back side of the array substrate SB1 constituting the liquid crystal display. Various types of backlights are applicable, and any one of a light-emitting diode (LED), cold cathode fluorescent lamp (CCFL) and the like is applicable as the light source thereof, but detailed explanations on the configuration thereof are omitted.

The array substrate SB1 is formed of a first insulation substrate 10 including optical transparency. On the first insulation substrate 10, the auxiliary capacity line CSL is formed. The source lines SL are formed on a first interlayer dielectric film 11, and are covered with a second interlayer dielectric film 12. Incidentally, the not shown gate lines are formed, for example, in an identical layer with the auxiliary capacity line CSL, and are disposed between the first insulation substrate 10 and the first interlayer dielectric film 11. The pixel electrodes PE are formed on the second interlayer dielectric film 12, and opposes the auxiliary capacity line CSL at the edges thereof.

A first alignment layer AL1 is disposed on a face of the array substrate SB1, which opposes the counter-substrate SB2, and extends substantially over the whole of the display portion DYP. This first alignment layer AL1 covers the pixel electrodes PE and the like, and is also disposed on the second interlayer dielectric film 12. The first alignment layer AL1 like this is formed of a material exhibiting horizontal orientation.

The counter-substrate SB2 is formed of a second insulation substrate 20 including optical transparency, and is provided with a black matrix BM, color filter CF, overcoat layer OC, common electrode CE, second alignment layer AL2, and the like.

The black matrix BM partitions the respective display pixels PX, and forms openings opposing the pixel electrodes PE. That is, the black matrix BM is disposed to oppose the wired portion including the source line SL, gate line GL, auxiliary capacity line CSL, switching elements, and the like. Although only the black matrix BM extending along the second direction Y is illustrated herein, the other portion of the black matrix BM extending along the first direction X may also be provided. This black matrix BM is disposed on an inner face 20A of the second insulation substrate 20, which opposes the array substrate SB1.

The color filters CF are disposed corresponding to the respective display pixels PX. That is, the color filters CF are disposed to the openings on the inner face 20A of the second insulation substrate 20, and each portion thereof is put on the black matrix BM. The color filters CF, which are disposed to the display pixels PX adjoining to each other in the first direction X, include different colors with each other. The color filters are made of, for example, resin materials colored in three primary colors of red, blue and green, respectively. Red color filters made of the resin material colored in red are disposed to respond to red pixels, blue color filters made of the resin material colored in blue are disposed to respond to blue pixels, and green color filters made of the resin material colored in green are disposed to respond to green pixels. The boundary between the respective color filters CF exists at a position coinciding with the black matrix BM.

The overcoat layer OC covers the color filters CF, and lessens the influence of asperities on the surface of the color filters CF.

The common electrode CE is formed on a side of the overcoat layer OC, which opposes the array substrate SB1, and opposes the pixel electrodes PE through the liquid crystal layer LQ.

The second alignment layer AL2 is disposed on a face of the counter-substrate SB2, which opposes the array substrate SB1, and extends substantially over the whole of the display portion DYP. This second alignment layer AL2 covers the common electrode CE, overcoat layer OC, and the like. The second alignment layer AL2 like this is formed of a material exhibiting horizontal orientation.

These first alignment layer AL1 and second alignment layer AL2 are subjected to an alignment treatment (for example, rubbing treatment or optical alignment treatment) for causing liquid crystal molecules of the liquid crystal layer LQ to undergo initial alignment.

The array substrate SB1 and the counter-substrate SB2 are configured so that the first alignment layer AL1 and the second alignment layer AL2 respective thereof oppose to each other. Between the first alignment layer AL1 of the array substrate SB1 and the second alignment layer AL2 of the counter-substrate SB2, there is placed a column-like spacer, for example, formed of a resin material integrally with the substrate on one side, and a predetermined cell gap is thereby provided. The array substrate SB1 and the counter-substrate SB2 are put together with the predetermined cell gap by a seal material (not shown) on the outside of the display portion DYP.

The liquid crystal layer LQ is placed between the first alignment layer AL1 and the second alignment layer AL2, and is held in the cell gap provided between the array substrate SB1 and the counter-substrate SB2. The liquid crystal layer LQ like this is formed of, for example, a liquid crystal material including positive dielectric anisotropy (of a positive-type).

On the outer surface of the array substrate SB1, i.e., the outer surface 10B of the first insulation substrate 10 constituting the array substrate SB1, a first optical device OD1 is attached with an adhesive or the like. This first optical device OD1 is positioned on the side opposing the backlight of the liquid crystal display, and controls the polarized state of light incident from the backlight to the liquid crystal display. The first optical device OD1 includes a first polarizing plate (not illustrated) including a first polarizing axis (or a first absorption axis).

On the outer surface of the counter-substrate SB2, i.e., the outer surface 20B of the second insulation substrate 20 constituting the counter-substrate SB2, a second optical device OD2 is attached with an adhesive or the like. This second optical device OD2 is positioned on the display surface side of the liquid crystal display, and controls the polarized state of light emitted from the liquid crystal display. The second optical device OD2 includes a second polarizing plate (not illustrated) including a second polarizing axis (or a second absorption axis).

Figure 4:
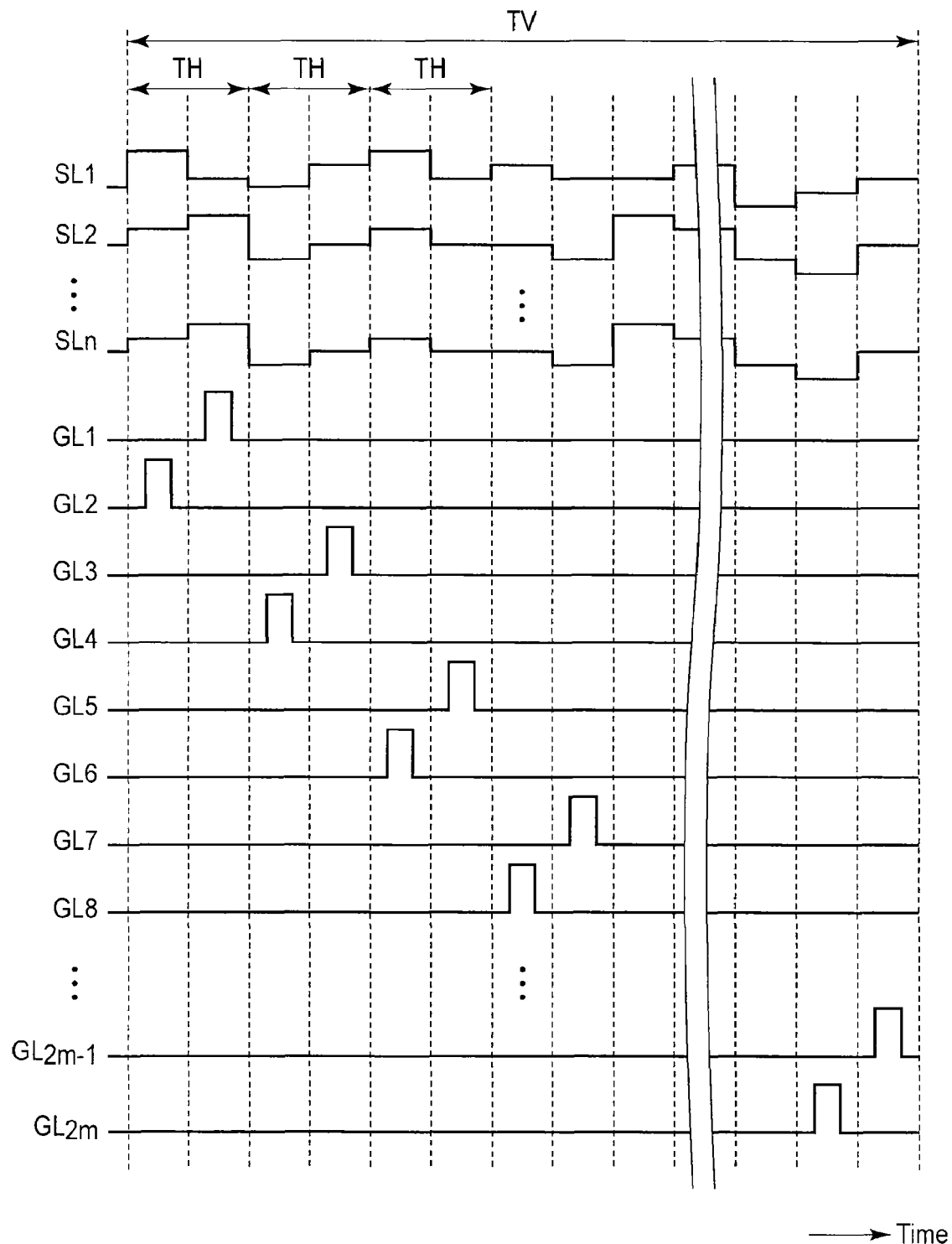
FIG. 4 is a diagram for explaining an example of the drive method of the above liquid crystal display.

FIG. 4 is a diagram for explaining an example of the drive method of the above liquid crystal display.

An example of the method for driving the display pixels PX arranged in a matrix with m rows and 2n columns will be described below. The gate drivers GDL, GDR and source driver SD drive the display pixels PX in respective rows within one horizontal period TH, and also drive the display pixels PX in m columns within one vertical period TV.

The gate driver GDL drives the even-numbered gate lines GL2, GL4, . . . , GL2m sequentially in the first half of each horizontal period TH. For example, at the time when the gate driver GDL has driven the gate line GL2, the source electrode SE and drain electrode DE of the pixel switch SW of the display pixel PX connected on the left side of the source line SL are conducted to each other at the first row, and an image signal is applied from the corresponding source line SL.

The gate driver GDR drives the odd-numbered gate lines GL1, GL3, . . . , GL2m-1 sequentially in the other half of each horizontal period TH. For example, at the time when the gate driver GDR has driven the gate line GL1, the source electrode SE and drain electrode DE of the pixel switch SW of the display pixel PX connected on the right side of the source line SL are conducted to each other at the first row, and an image signal is applied from the corresponding source line SL.

The source driver SD provides the image signal, which is applied to the display pixel PX connected on the left side of the source line SL, to the source line SL in the first half of one horizontal period TH, and also provides the image signal, which is applied to the display pixel PX connected on the right side of the source line SL, to the source line SL in the other half of one horizontal period TH.

That is, in the liquid crystal display of this embodiment, it is possible to provide image signals to the display pixels PX of two columns through one source line SL. The number of source lines SL driven by the source driver SD is therefore cut in half, and a costly source driver thereby becomes unnecessary.

Since each of the gate drivers GDL, GDR sequentially drives the m pieces of gate lines GL in this embodiment, it is not necessary to drive the gate lines GL at high speed. Accordingly, a costly gate driver thereby also becomes unnecessary.

According to this embodiment, as described above, it is possible to hold down an increase of costs required for liquid crystal displays.

Next, the liquid crystal display of a second embodiment will be described in detail with reference to the drawings.

As to a similar configuration as with the above first embodiment, identical reference characters are provided and repeated explanations are omitted in the following description.

Figure 5:
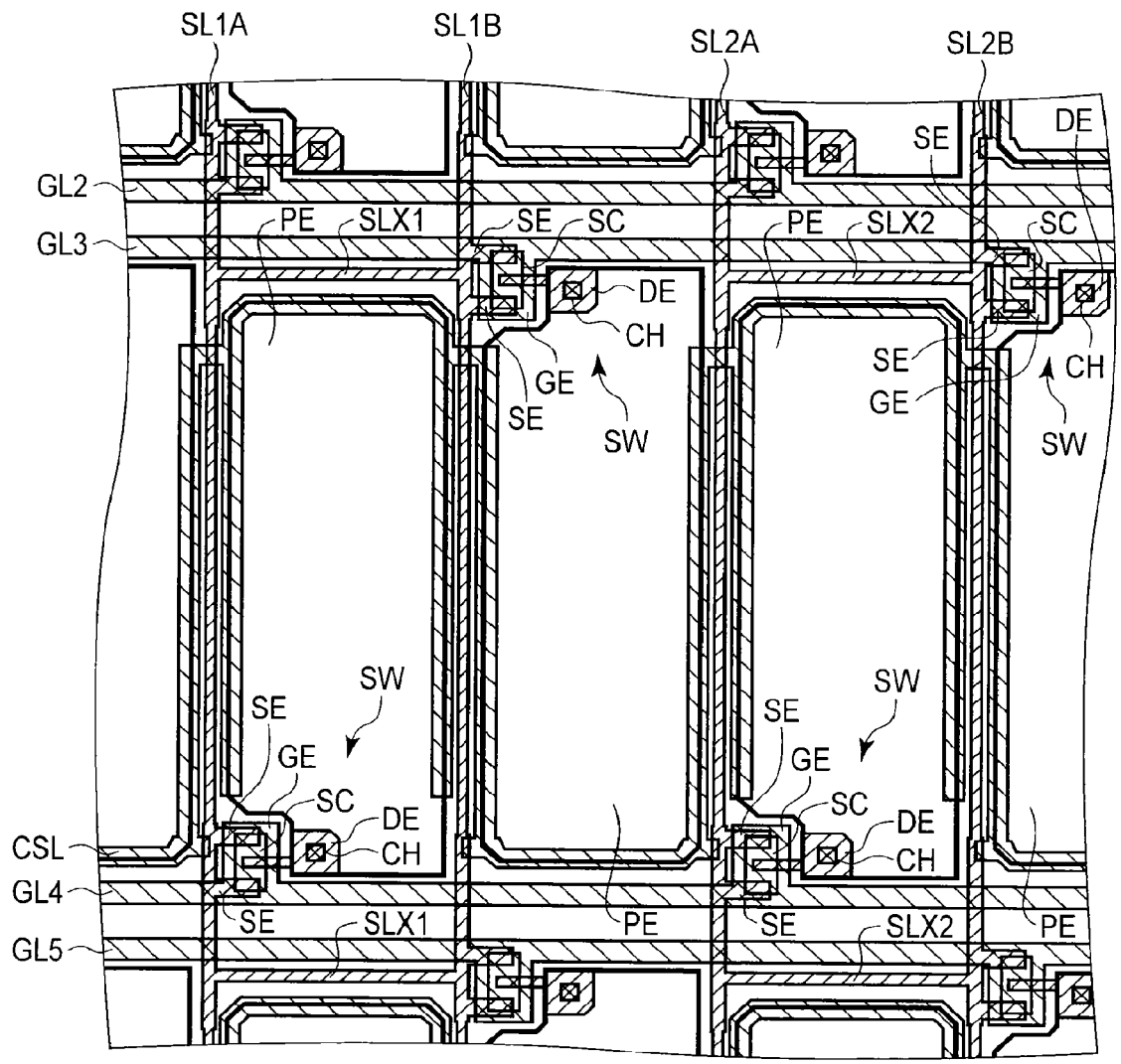
FIG. 5 is a drawing schematically illustrating a configuration example of display pixels of the liquid crystal display according to the second embodiment.

FIG. 5 is a drawing schematically illustrating a configuration example of display pixels of the liquid crystal display according to this embodiment.

In this embodiment, a source line SL is provided with first source lines SLA (SLA1, SLA2, . . . , SLAn), second source lines SLB (SLB1, SLB2, . . . , SLBn), and connecting sections SLX. To the first source lines SLA and second source lines SLB, a common image signal output from a source driver SD is provided.

The first source lines SLA and the second source lines SLB extend substantially in parallel with a second direction Y along columns of display pixels PX. The first source lines SLA and the second source lines SLB are respectively placed on both sides of the column of pixel electrodes PE, which align in the second direction Y, in a first direction X.

The connecting sections SLX extend in the first direction X between the pixel electrodes PE aligning in the second direction Y, and electrically connect the first source lines SLA and the second source lines SLB, respectively. The first source line SLA1 and second source line SLB1 are electrically connected to each other through the connecting sections SLX. Likewise, the first source line SLA2 and the second source line SLB2 are electrically connected to each other through the other connecting sections SLX.

By connecting the first source line SLA2 with the second source line SLB2 to each other at multiple places through the connecting sections SLX like this, even if a portion of either the first source line SLA2 or the second source line SLB2 is broken, it becomes possible to provide the image signal to forward display pixels PX than the broken place through the other source lines and connecting sections SLX.

According to this embodiment, it is therefore possible to provide a liquid crystal display that avoids the occurrence of a dark line and bright line to improve manufacturing yield, and also has high display quality level.

Although being placed on both sides of each of the pixel electrodes PE in the second direction Y in FIG. 5, the connecting sections SLX may be placed only one side of each of the pixel electrodes PE in the second direction Y. The connecting sections SLX are allowed to be placed so as to connect the first source line SLA2 and the second source line SLB2 at least at one place, but the more places connected with the connecting sections SLX, the likelier it becomes that display failure due to a break in the line is avoided.

A pixel switch SW has a semiconductor layer SC, a gate electrode GE, a source electrode SE, and a drain electrode DE. The semiconductor layer SC is placed on the gate electrode GE through an insulation layer. The gate electrode GE is formed in a layer identical with that of gate lines GL, and the source electrode SE and the drain electrode DE are formed in a layer identical with that of the source lines SL.

The gate electrode GE is electrically connected to the gate line GL (or integrally formed therewith). In this embodiment, the gate electrode GE of the pixel switch SW disposed in the vicinity of each of the intersections of the gate lines GL and the first source lines SLA extends upward from the gate line GL along the second direction Y, while the gate electrode GE of the pixel switch SW disposed in the vicinity of each of the intersections of the gate line GL and second source lines SLB extends downward from the gate line GL along the second direction Y.

The source electrode SE is electrically connected to the source line SL (or integrally formed therewith). The source electrode SE extends rightward from either the first source lines SLA and second source lines SLB along the first direction X, and is placed in an upper portion of the semiconductor layer SC. In the example illustrated in FIG. 5, the source electrode SE is protruded from two places of either the first source lines SLA and the second source lines SLB in the vicinity of each of the intersections of the gate lines GL and either the first source lines SLA and second source lines SLB.

The drain electrode DE is electrically connected to each of the pixel electrodes PE (or integrally formed therewith). The drain electrode DE extends between an upper portion of the semiconductor layer SC and each of the pixel electrodes PE along the first direction X, and is electrically connected to each of the pixel electrodes PE through a contact hole CH, which is provided at a location where the drain electrode DE is overlaid on each of the pixel electrodes PE through an insulation layer. At the upper portion of the semiconductor layer SC, the drain electrode DE is placed between a couple of the source electrodes SE.

The liquid crystal display of this embodiment has a similar configuration as with the first embodiment except the configuration described above. In this embodiment, the configuration of the pixel switch SW is common in all the display pixels PX. That is, in any one of the display pixels PX, the source electrode SE extends rightward from either the first source lines SLA and second source lines SLB along the first direction X, and the drain electrode DE extends between an upper portion of the semiconductor layer SC and each of the pixel electrodes PE along the first direction X. Accordingly, even if the placement of a conductive layer deviates when forming an array substrate SB1, the capacity generated in the pixel switch SW, particularly the capacity Cgd generated between the gate electrode GE and the drain electrode DE is increased or decreased by an identical amount in all the pixel switches SW.

In the liquid crystal display of the first embodiment described above, for example, in the case in which the conductive layer where the source line SL is formed deviates upward with respect to the conductive layer where the gate line GL is formed, the capacity Cgd in the pixel switch SW of the first display pixel PX1 becomes large because the area where the gate electrode GE and the drain electrode DE oppose to each other becomes large, while the capacity Cgd in the pixel switch SW of the second display pixel PX2 becomes small because the area where the gate electrode GE and the drain electrode DE oppose to each other becomes small. In each of the display pixels PX including a different capacity Cgd, since a difference arises in punch-through voltages, flicker or burn-in may occasionally happen.

Conversely thereto, in this embodiment, since the capacity Cgd generated in all the pixel switches SW is increased or decreased by an identical amount even if the placement of a conductive layer has deviated, it is possible to provide a liquid crystal display that avoids the occurrence of flicker and burn-in to improve manufacturing yield, and also has high display quality level.

That is, according to the liquid crystal display of the this embodiment, it is possible to hold down an increase of costs required for liquid crystal displays and to provide liquid crystal displays including high display quality level through improvement of manufacturing yield, as with those of the first embodiment described above.

It is noted that the configuration of the pixel switch SW is not limited to that illustrated in FIG. 5.

Figure 6:
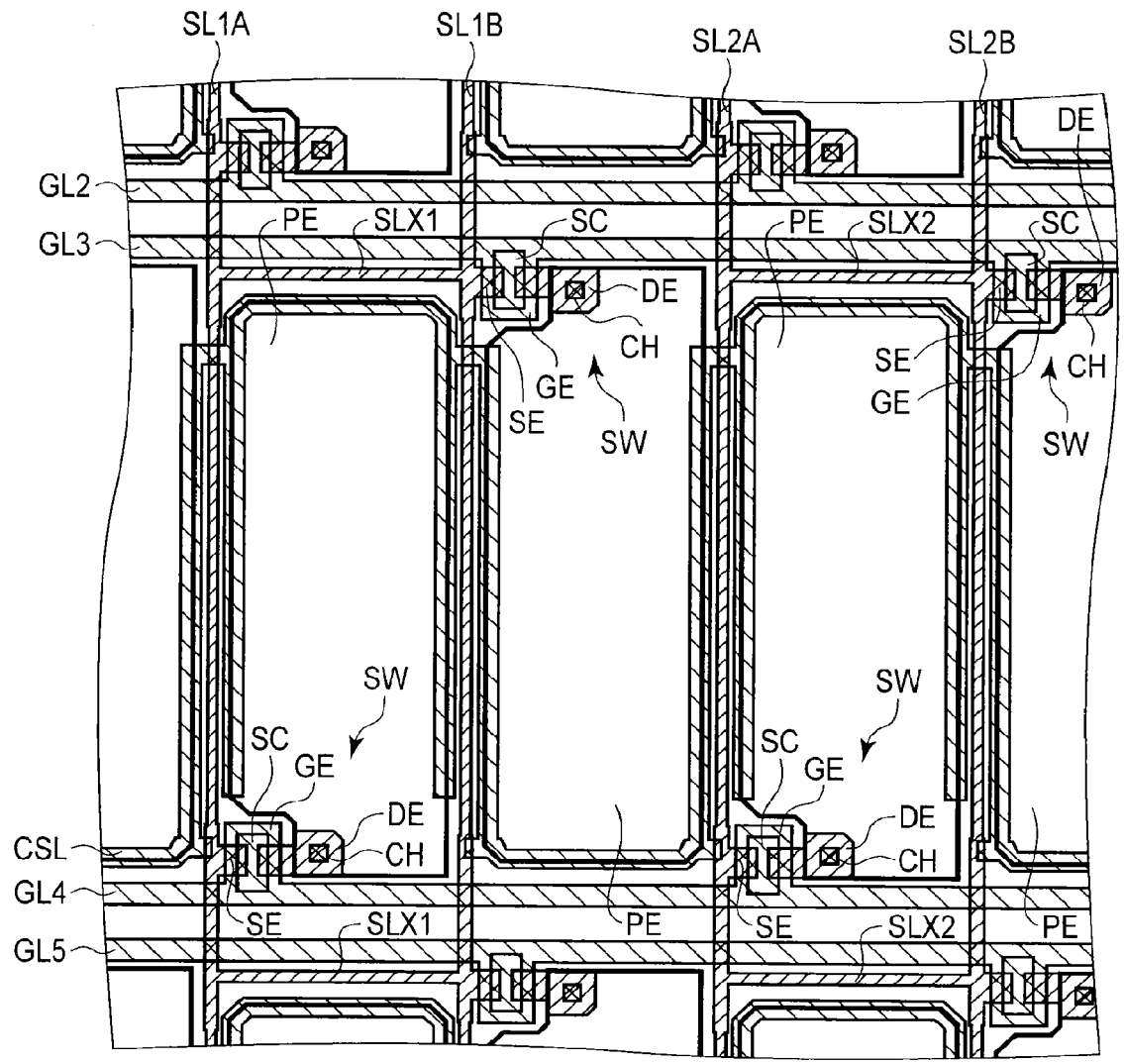
FIG. 6 is a drawing schematically illustrating another configuration example of display pixels of the liquid crystal display according to the second embodiment.

FIG. 6 is a drawing schematically illustrating another configuration example of display pixels of the liquid crystal display of this embodiment. In this example, the configuration of the pixel switch SW is different from that illustrated in FIG. 5. That is, the source electrode SE is protruded rightward from either the first source lines SLA and second source lines SLB along the first direction X, and extends to an upper portion of the semiconductor layer SC. In the example illustrated in FIG. 6, the source electrode SE is protruded from one place of either the first source lines SLA and second source lines SLB in the vicinity of each of the intersections of the gate line GL and either the first source lines SLA and second source lines SLB.

The drain electrode DE extends from an upper portion of the semiconductor layer SC to each of the pixel electrodes PE along the first direction X, and is electrically connected to each of the pixel electrodes PE through a contact hole CH, which is provided at a location where the drain electrode DE is overlaid on each of the pixel electrodes PE through an insulation layer. At an upper portion of the semiconductor layer SC, the drain electrode DE is placed with a predetermined distance from the source electrode SE in the first direction X.

The configuration except described above is similar as with that shown in FIG. 5. Also in the example illustrated in FIG. 6, since the capacity Cgd generated in all the pixel switches SW is increased or decreased by an identical amount even if the placement of a conductive layer has deviated, it is possible to provide a liquid crystal display that avoids the occurrence of flicker and burn-in to improve manufacturing yield, and also has high display quality level.

That is, it is possible to hold down an increase of costs required for liquid crystal displays and to provide liquid crystal displays including high display quality level through improvement of manufacturing yield, as with those of the first embodiment described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid crystal display comprising:
a first source line and a second source line;
a first pixel electrode and a second pixel electrode arranged between the first source line and the second source line;
a first pixel switch to switch connection of the first source line with the first pixel electrode;
a second pixel switch to switch connection of the second source line with the second pixel electrode; and
an auxiliary capacity line extending along three edges of each of the pixel electrodes,
wherein the auxiliary capacity line extends along the edges excluding an edge at which the first pixel electrode is connected to the first pixel switch and an edge at which the second pixel electrode is connected to the second pixel switch,
the auxiliary capacity line is not opposed to any source lines between the first pixel electrode and the second pixel electrode, and
the auxiliary capacity line has a ring shape portion between the first pixel electrode and the second pixel electrode.

2. The liquid crystal display of claim 1, wherein
the auxiliary capacity line extends in a meandering shape along the edges of the pixel electrodes.

3. The liquid crystal display of claim 1, further comprising a first gate line and a second gate line intersecting the first source line and the second source line,
wherein the first pixel electrode and the second pixel electrode are arranged in a region surrounded by the first and second gate lines and the first and second source lines.

4. The liquid crystal display of claim 3, wherein
the first pixel switch comprises a first semiconductor layer, a first gate electrode extending from the first gate line and placed in a lower portion of the first semiconductor layer, and a first drain electrode placed at an upper portion of the first semiconductor layer,
the first drain electrode extends between a lower portion of the first pixel electrode and the upper portion of the first semiconductor layer in the first direction,
the second pixel switch comprises a second semiconductor layer, a second gate electrode extending from the second gate line and placed in a lower portion of the second semiconductor layer, and a second drain electrode placed at an upper portion of the second semiconductor layer, and
the second drain electrode extends between a lower portion of the second pixel electrode and the upper portion of the second semiconductor layer in the first direction.

5. The liquid crystal display of claim 4, wherein
the first pixel switch is placed on a side of the first gate line in the first pixel electrode, and
the second pixel switch is placed on a side of the second gate line in the second pixel electrode.

6. The liquid crystal display of claim 1, wherein
a portion of the auxiliary capacity line opposing each of the first and second source lines has a ring shape portion from which a part of each of the first and second source lines is exposed.

7. The liquid crystal display of claim 1, wherein
a portion of the auxiliary capacity line opposing each of the first and second source lines has a bifurcated shape sandwiching each of the first and second source lines.

8. The liquid crystal display of claim 1, wherein
each of the first and second pixel electrodes has four edges including a pair of first edges extending substantially in parallel to each of the source lines, and a pair of second edges intersecting the pair of first edges, and
the auxiliary capacity line extends along three edges of each of the pixel electrodes including the pair of first edges.

* * * * *